(12) United States Patent
Che

(10) Patent No.: US 6,297,116 B1
(45) Date of Patent: Oct. 2, 2001

(54) METHOD FOR MANUFACTURING A METAL OXIDE SEMICONDUCTOR (MOS)-BASED STRUCTURE

(75) Inventor: Shyng-Yeuan Che, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/427,302

(22) Filed: Oct. 26, 1999

(30) Foreign Application Priority Data

Feb. 5, 1999 (TW) .................................. 88101809

(51) Int. Cl.[7] ...................... H01L 21/336; H01L 21/302; H01L 21/467
(52) U.S. Cl. ........................... 438/305; 438/303; 438/723
(58) Field of Search .................................. 438/305, 303, 438/723, 268, 232, 192, 286

(56) References Cited

U.S. PATENT DOCUMENTS

| | | | |
|---|---|---|---|
| 4,944,682 | * | 7/1990 | Cronin et al. ......................... 437/192 |
| 5,015,595 | * | 5/1991 | Wollesen ................................ 437/31 |
| 5,180,689 | * | 1/1993 | Liu et al. ............................... 437/228 |
| 5,200,351 | * | 4/1993 | Hadjizadeh-Amini ................. 437/44 |
| 5,637,525 | * | 6/1997 | Dennison .............................. 438/232 |
| 5,705,439 | * | 1/1998 | Chang ................................... 438/286 |
| 5,817,554 | * | 10/1998 | Tseng .................................... 438/253 |
| 5,821,594 | * | 10/1998 | Kasai ..................................... 257/410 |
| 5,930,630 | * | 7/1999 | Hshieh et al. ......................... 438/268 |
| 5,972,804 | * | 10/1999 | Tobin et al. ........................... 438/786 |
| 6,004,852 | * | 12/1999 | Yeh et al. .............................. 438/303 |
| 6,071,826 | * | 6/2000 | Cho et al. ............................. 438/723 |
| 6,075,257 | * | 6/2000 | Song ...................................... 257/59 |

* cited by examiner

Primary Examiner—John F. Niebling
Assistant Examiner—Walter L. Lindsay, Jr.
(74) Attorney, Agent, or Firm—Klein & Szekeres, LLP

(57) ABSTRACT

A method for manufacturing a metal oxide semiconductor (MOS)-based structure is provided. The method includes the steps of (a) providing a substrate, (b)forming a conducting layer on a portion of said substrate to serve as a gate, (c) forming an oxide layer over the conducting layer and an another portion of the substrate, (d) forming an etching stop layer over the oxide layer, (e) forming a lightly doped region in the another portion of the substrate, (f) forming an insulating layer over the etch stop layer and then partially removing the insulating layer to form spacers alongside the conducting layer and on a portion of the lightly doped region, and (g) implanting a dopant into an another portion of the lightly doped region for forming a drain and a source. The ratio of the etching selectivity of the etching stop layer to that of the insulating layer is relatively high enough to prevent the lightly doped region and the field oxide from being lost during the formation of the spacers.

19 Claims, 6 Drawing Sheets

METHOD FOR MANUFACTURING A METAL OXIDE SEMICONDUCTOR (MOS)-BASED STRUCTURE

FIELD OF THE INVENTION

The present invention is related to a method for manufacturing a metal oxide semiconductor (MOS)-based structure, and more particularly to a method for preventing the loss of devices on the wafer during the process for fabricating an MOS transistor.

BACKGROUND OF THE INVENTION

Currently, in the manufacturing process of metal oxide semiconductor (MOS), a lightly doped drain (LDD) is often used to prevent the short channel effect. Please refer to FIGS. 1a~1f which are schematic diagrams showing a conventional process for manufacturing an MOS transistor with a lightly doped drain. In FIG. 1a, a field oxide 103, a gate oxide 101, and a polysilicon layer 102 (serving as a gate) are formed on the silicon substrate 100 in sequence. Thereafter, a silicon dioxide 104 is formed over the silicon substrate 100 and the gate 102 by thermal oxidation as shown in FIG. 1b and then an ion implantation is performed to form a lightly doped drain 105 in the silicon substrate 100 by using the gate 102 as a mask, shown in FIG. 1c. In FIG. 1d, a silicon dioxide layer 106 is deposited on the surface of the wafer by plasma enhanced chemical vapor deposition (PECVD) and then etched by an anisotropic etch to form spacers 107 alongside the gate 102 (shown in FIG. 1e). The spacers can be used as a mask for the subsequent heavily doped implantation. Finally, after heavily doping the lightly doped drain 105, a lightly doped region 108 and a heavily doped region 109 are formed as shown in FIG. 1f and serve as a drain and a source.

However, during the etching process for forming the spacers, an over-etched situation may be happened, thereby resulting in a loss of the surfaces of the field oxide 103 and the lightly doped drain structure 105 9 (designated by an imaginary line shown in FIG. 1e). For a small-size device, a shallow junction may prevent the short channel effect and punch through problem, but the above-described etching process for forming the spacers will seriously detract from the advantage of the shallow junction.

In addition, the size of the field oxide must be maintained to a certain degree in order to obtain a better isolation. However, this will cause that the device's size can not be effectively decreased. Therefore, it is tried by the Applicant to deal with the defects encountered by the prior art.

SUMMARY OF THE INVENTION

An object of the present invention is to provide a method for manufacturing a metal oxide semiconductor (MOS)-based structure.

Another object of the present invention is to provide a method for preventing the loss of devices in a wafer.

According to the present invention, the method includes the steps of (a) providing a substrate, (b) forming a conducting layer on a portion of said substrate to serve as a gate, (c) forming an oxide layer over the conducting layer and an another portion of the substrate, (d) forming an etching stop layer over the oxide layer, (e) forming a lightly doped region in the another portion of the substrate, (f) forming spacers alongside the conducting layer and on a portion of the lightly doped region, and (g) implanting a dopant into an another portion of the lightly doped region for forming a drain and a source.

Preferably, the conducting layer is a polysilicon layer.

Certainly, the method further includes a step of forming a gate oxide between the conducting layer and the substrate.

The oxide layer is a silicon dioxide layer and formed by thermal oxidation.

Preferably, the etching stop layer is made of silicon nitride and has a thickness of about 150. It can be formed by plasma enhanced chemical vapor deposition (PECVD) or low pressure chemical vapor deposition (LPCVD).

Certainly, the spacers are formed by forming an insulating layer on the etching stop layer and the conducting layer and partially removing the insulating layer by an anisotropic etch while retaining a portion of the insulating layer alongside the conducting layer to serve as the spacers.

Certainly, the substrate further includes a field oxide. The ratio of the etching selectivity of the etching stop layer to that of the insulating layer is relatively high enough to prevent the lightly doped region and the field oxide from being lost during an etching process of forming the spacers.

Again, the lightly doped region is heavily doped by an ion implantation using the spacers as masks to obtain two doped regions with different concentrations of dopant to serve as a drain and a source. Certainly, the lightly doped region can be a p-type or n-type lightly doped drain (LDD).

In addition, the method further includes steps of (1) forming an intermediate layer over the etching stop layer, the spacers, and the conducting layer; (2) partially removing the intermediate layer to form a contact window and expose a portion of the etching stop layer; (3) removing the portion of the etching stop layer to expose a portion of the oxide layer in the contact window; (4) performing a reflow process of the intermediate layer; and (5) removing the portion of the oxide layer to expose the lightly doped region in the contact window and forming a metal layer in the contact window and over the exposed lightly doped region.

Preferably, the intermediate layer is made of borophosphosilicate glass (BPSG) and the metal layer can be formed by a sputtering process.

The present invention may best be understood through the following description with reference to the accompanying drawings, in which:

DETAILED DESCRIPTION OF THE PREFERRED EMBODIMENT

The present invention will now be described more detailedly with reference to the following embodiments. It is to be noted that the following descriptions of the preferred embodiments of this invention are presented herein for the purpose of illustration and description only. It is not intended to be exhaustive or to be limited to the precise form disclosed.

Please refer to FIGS. 2a~2j which shows a preferred embodiment of a method for manufacturing a metal oxide semiconductor (MOS) transistor according to the present invention.

Figure 1A:
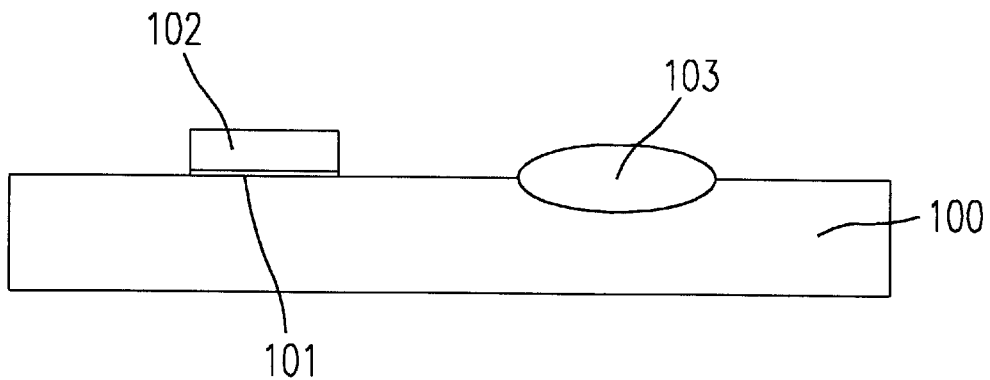
FIGS. 1a~1f are schematic diagrams showing a conventional method for manufacturing a metal oxide semiconductor (MOS) transistor.
Figure 1B:
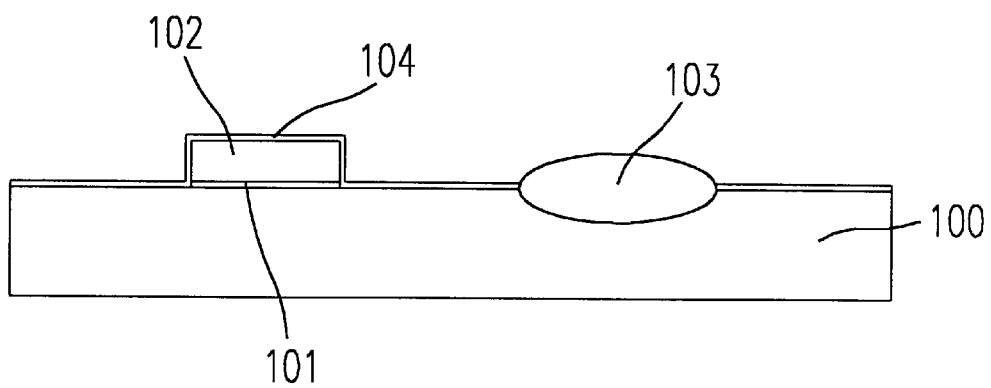
Figure 1C:
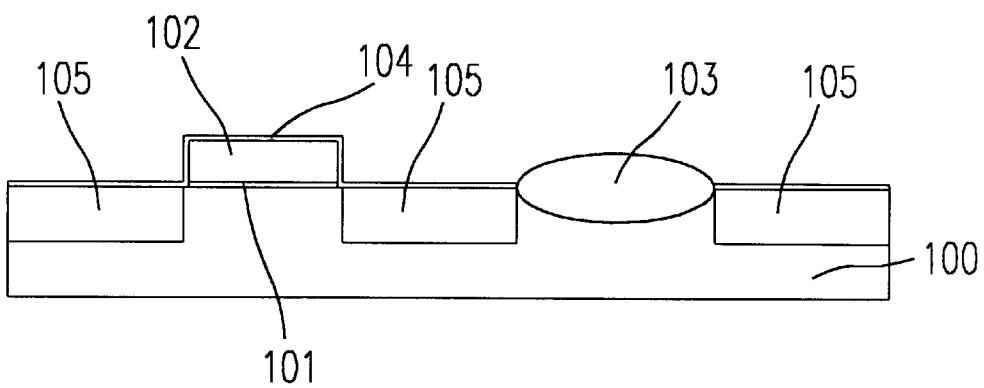
Figure 1D:
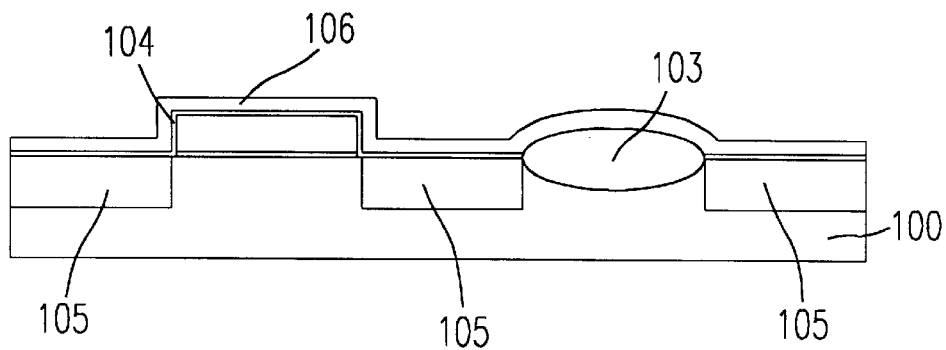
Figure 1E:
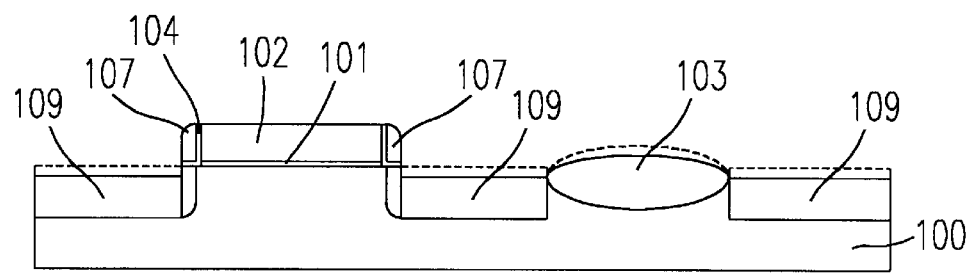
Figure 1F:
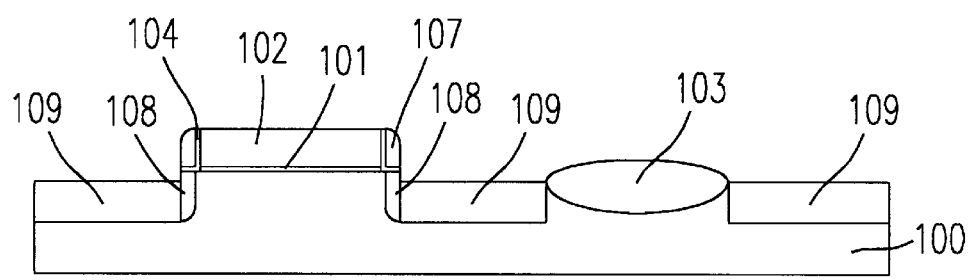
Figure 2A:
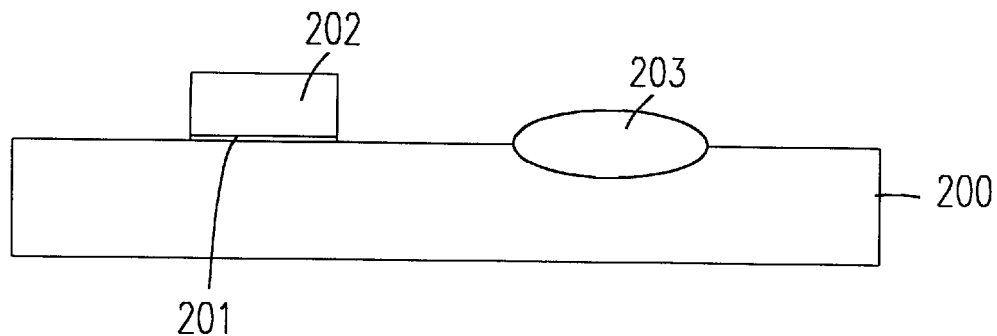
FIGS. 2a~2j are schematic diagrams showing a preferred embodiment of a method for manufacturing a metal oxide semiconductor (MOS) transistor according to the present invention.
Figure 2B:
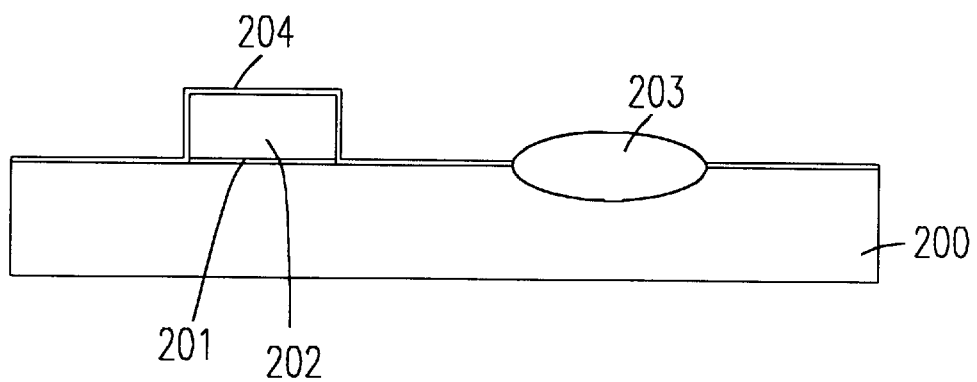

As shown in FIG. 2a, a field oxide 203, a gate oxide 201, and a polysilicon layer 202 (serving as a gate) are formed on the silicon substrate 200 in sequence. Then, an oxide layer 204 is formed over the silicon substrate 200 and the gate 202 by thermal oxidation as shown in FIG. 2b. The oxide layer 204 can be a silicon dioxide layer 204.

Figure 2C:
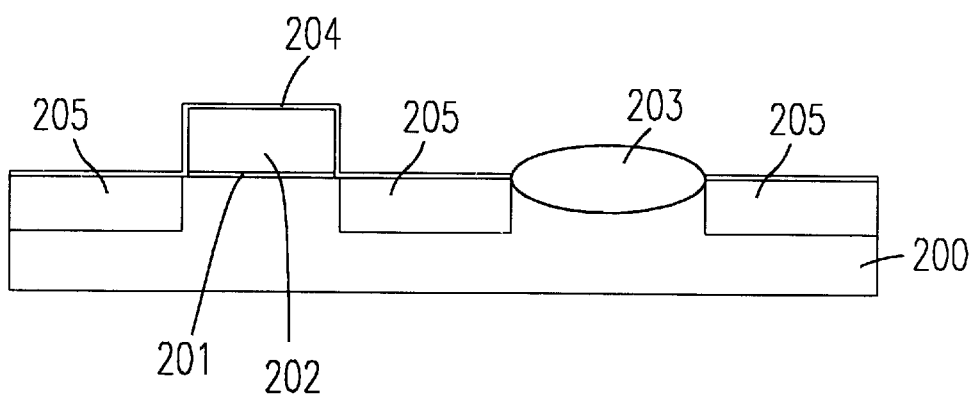
Figure 2D:
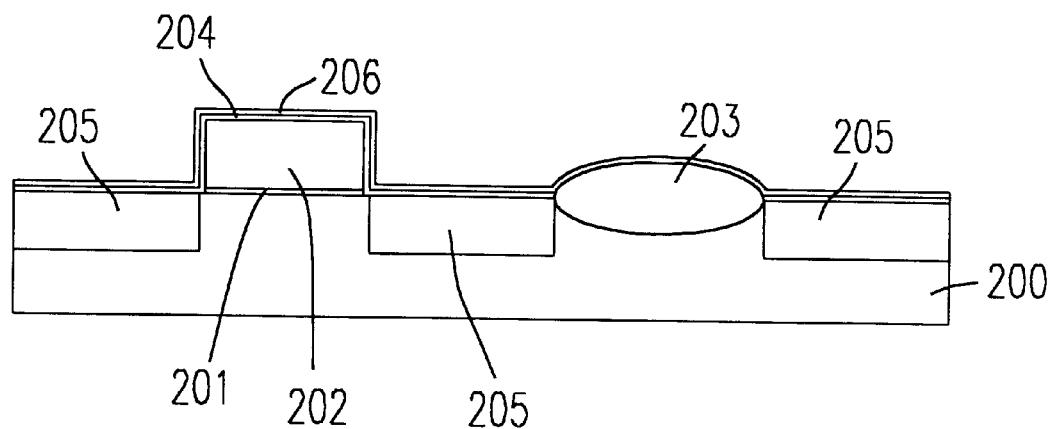

In FIG. 2c, an ion implantation is performed for forming a lightly doped drain 205 in the silicon substrate 200 by using the gate 202 as a mask. Thereafter, a silicon nitride layer 206 with a thickness of about 150 is formed on the wafer by plasma enhanced chemical vapor deposition (PECVD) or low pressure chemical vapor deposition (LPCVD) as an etching stop layer as shown in FIG. 2d.

Figure 2E:
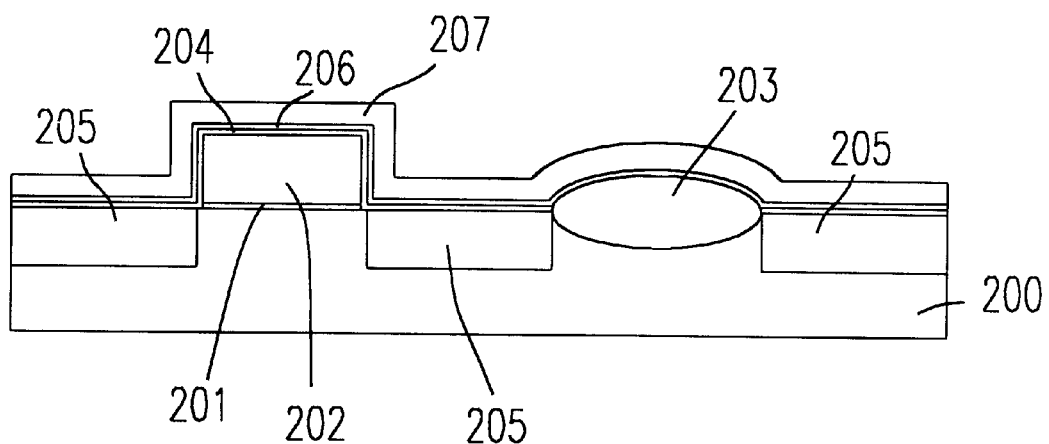
Figure 2F:
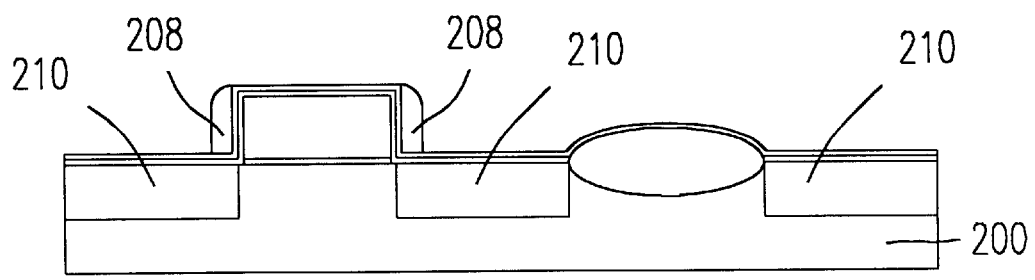

Then, an insulating layer (e.g. a silicon dioxide layer) 207 is formed on the silicon nitride layer 206 as shown in FIG. 2e and is removed by an anisotropic etch to form spacers 208 alongside the gate 202, as shown in FIG. 2f.

Figure 2G:
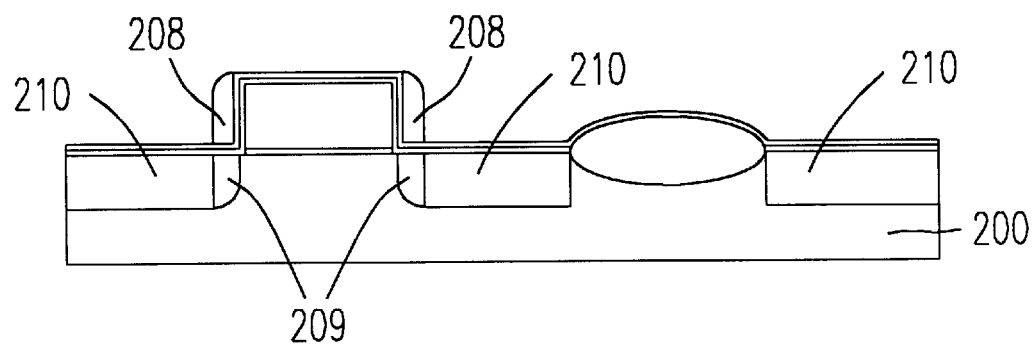

Again, the lightly doped drain 205 is heavily doped to form a lightly doped region 209 and a heavily doped region 210 by ion implantation using the spacers 208 as the masks, as shown in FIG. 2g. Certainly, the lightly doped region 209 and heavily doped region 210 can be n-type or p-type and serve as a drain and a source.

Figure 2H:
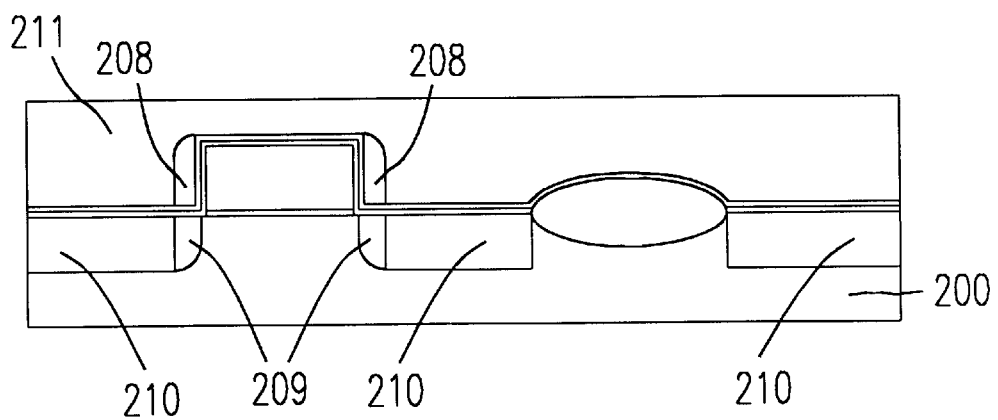
Figure 2I:
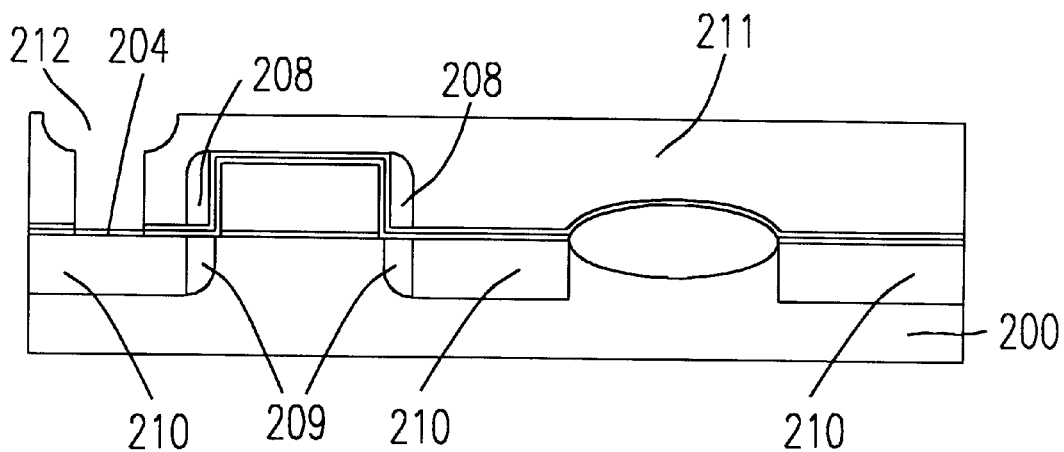
Figure 2J:
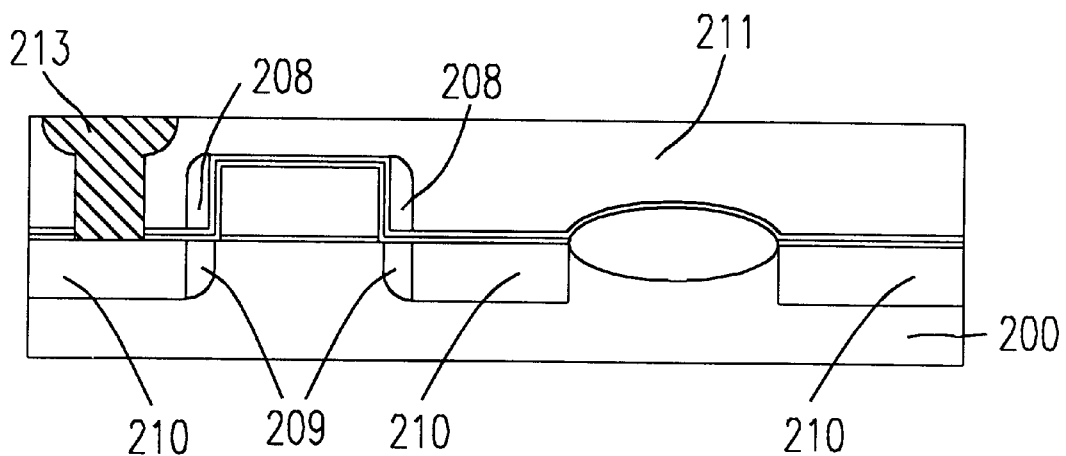

Sequentially, an intermediate layer 211, for example, a borophosphosilicate glass (BPSG), is formed over the etching stop layer 206 and the spacers 208 and then partially etched to form a contact window 212 and expose a portion of the etching stop layer, as shown in FIG. 2h. Thereafter, this portion of the etching stop layer is removed to expose the underlying silicon dioxide 204 as shown in FIG. 2i. Finally, after performing a reflow process of the BPSG layer 211, the exposed silicon dioxide 204 is removed and a metal layer 213 is formed in the contact window by a sputtering process to achieve the fabrication of an MOS transistor.

To sum up, the present invention provides a novel method for manufacturing a metal oxide semiconductor (MOS)-based structure. Because the ratio of the etching selectivity of the etching stop layer 206 to that of the insulating layer 207 is relatively high enough to prevent the lightly doped drain 205 and the field oxide 203 from being lost during an etching process for forming the spacers. Furthermore, during the formation of the contact window, this etching stop layer 206 can protect the the junction between the lightly doped region and the gate from being etched again. Certainly, the phenomenon of contact junction spiking, can also be avoided. On the other hand, the retained portion of the silicon dioxide layer 204 in the contact window can prevent the outgassing impurities from being doped in the contact surface during the reflow process of the BPSG layer 211. Therfore, the method of the present invention can greatly improve the defects encountered by the prior art and can be applied in the fabrication of the minimized device.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a metal oxide semiconductor (MOS)-based structure, comprising the steps of:
   providing a substrate;
   forming a conducting layer on a portion of the substrate;
   forming an oxide layer over said conducting layer and on another portion of said substrate;
   forming an etching stop layer over said oxide layer;
   forming a lightly doped region in said another portion of said substrate;
   forming spacers alongside said conducting layer and on a portion of said lightly doped region;
   implanting a dopant into another portion of said lightly doped region uncovered by said spacers to form a heavily doped region;
   forming an intermediate layer over said etching stop layer, said spacers, and said conducting layer;
   partially removing said intermediate layer to form a contact window and to expose a portion of said etching stop layer;
   removing said portion of said etching stop layer to expose a portion of said oxide layer in said contact window;
   performing a reflow process of said intermediate layer; and
   removing said portion of said oxide layer to expose said heavily doped region in said contact window and forming a metal layer in said contact window and over said exposed heavily doped region.

2. The method according to claim 1 wherein said conducting layer is a polysilicon layer and serves as a gate.

3. The method according to claim 1 further comprising a step of forming a gate oxide between said conducting layer and said substrate.

4. The method according to claim 1 wherein said oxide layer is a silicon dioxide layer.

5. The method according to claim 1 wherein said oxide layer is formed by thermal oxidation.

6. The method according to claim 1 wherein said etching stop layer is made of silicon nitride.

7. The method according to claim 1 wherein said etching stop layer is formed by one of plasma enhanced chemical vapor deposition (PECVD) and low pressure chemical vapor deposition (LPCVD).

8. The method according to claim 1 wherein said etching stop layer has a thickness of about 150.

9. The method according to claim 1 wherein said spacers are formed by steps of:
   forming an insulating layer on said etching stop layer and said conducting layer; and
   partially removing said insulating layer while retaining a portion of said insulating layer alongside said conducting layer to form said spacers.

10. The method according to claim 9 wherein said insulating layer is made of silicon dioxide.

11. The method according to claim 9 wherein said insulating layer is partially removed by an anisotropic etch.

12. The method according to claim 9 wherein said substrate further includes a field oxide.

13. The method according to claim 12 wherein a ratio of the etching selectivity of said etching stop layer to that of said insulating layer is relatively high enough to prevent said lightly doped region and said field oxide from being lost during the formation of said spacers.

14. The method according to claim 1 wherein said lightly doped region is heavily doped by an ion implantation using said spacers as masks to obtain two doped regions with different concentrations of dopant to serve as a drain and a source.

15. The method according to claim 1 wherein said lightly doped region is a p-type lightly doped drain (LDD).

16. The method according to claim 1 wherein said lightly doped region is an n-type lightly doped drain (LDD).

17. The method according to claim 1, wherein said intermediate layer is made of borophosphosilicate glass.

18. The method according to claim 1, wherein said metal layer is formed by a sputtering process.

19. A method for preventing devices in a wafer from being lost during the subsequent etching process, comprising the steps of:

forming an etching stop layer over said wafer having a field oxide, a gate and a lightly doped region;

forming an insulating layer over said etching stop layer;

partially removing said insulating layer to form spacers alongside said gate, wherein a ratio of the etch selectivity of said insulating layer to that of said etching stop layer is relatively high enough to protect said field oxide and said lightly doped region from being etched while forming said spacers;

implanting a dopant into a portion of said lightly doped region uncovered by said spacers to form a heavily doped region;

forming an intermediate layer over said etching stop layer, said spacers, and said gate;

partially removing said intermediate layer to form a contact window and to expose a portion of said etching stop layer;

removing said portion of said etching stop layer to expose a portion of an oxide layer formed on said wafer in said contact window;

performing a reflow process of said intermediate layer; and removing said portion of said oxide layer to expose said heavily doped region in said contact window and forming a metal layer in said contact window and over said exposed heavily doped region.

* * * * *